United States Patent
Tiwari

(10) Patent No.: US 11,405,037 B2
(45) Date of Patent: Aug. 2, 2022

(54) DRIVER CIRCUIT OF VOLTAGE TRANSLATOR

(71) Applicant: NXP B.V., Eindhoven (NL)

(72) Inventor: Chandra Prakash Tiwari, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/247,654

(22) Filed: Dec. 18, 2020

(65) Prior Publication Data

US 2022/0200596 A1 Jun. 23, 2022

(51) Int. Cl.
*H03K 19/0175* (2006.01)
*G06F 1/26* (2006.01)
*H03K 5/1252* (2006.01)
*H02M 3/00* (2006.01)

(52) U.S. Cl.
CPC ....... *H03K 19/017509* (2013.01); *G06F 1/26* (2013.01); *H03K 5/1252* (2013.01); *G06F 1/266* (2013.01); *H02M 3/00* (2013.01)

(58) Field of Classification Search
CPC .......... H03K 19/017509; H03K 5/1252; G06F 1/266; G06F 1/26; H02M 3/00
USPC .............................................. 713/300; 326/80
See application file for complete search history.

(56) References Cited

U.S. PATENT DOCUMENTS

| | | | |
|---|---|---|---|
| 5,479,124 A | 12/1995 | Pun et al. | |
| 6,040,724 A | 3/2000 | Kamiya | |
| 6,133,749 A | 10/2000 | Hansen et al. | |
| 6,437,622 B1 | 8/2002 | Tinsley et al. | |
| 6,639,423 B2 | 10/2003 | Martin et al. | |
| 6,704,818 B1 | 3/2004 | Martin et al. | |
| 7,446,576 B2 | 11/2008 | Fiedler | |
| 7,471,111 B2 | 12/2008 | Seth et al. | |
| 7,683,672 B2 | 3/2010 | Bartlett | |
| 7,928,766 B2* | 4/2011 | Welty | H03K 19/018592 327/333 |
| 10,181,852 B1 | 1/2019 | Tiwari et al. | |
| 10,566,975 B1 | 2/2020 | Tiwari et al. | |
| 10,659,051 B1* | 5/2020 | Tiwari | H03K 19/018592 |
| 2004/0056700 A1* | 3/2004 | Amick | H03K 19/018521 327/333 |
| 2008/0151514 A1* | 6/2008 | Yancey | H05K 1/0262 361/761 |

(Continued)

FOREIGN PATENT DOCUMENTS

EP 0 678 983 B1 8/1998

*Primary Examiner* — Ji H Bae

(57) ABSTRACT

A driver circuit of a voltage translator includes a bias voltage generator, a drive voltage generator, an output voltage generator, and a filter circuit. The bias voltage generator is configured to receive a supply voltage, a first input voltage, and a feedback voltage, and generate a bias voltage. The feedback voltage controls an amplitude of the bias voltage. The drive voltage generator is configured to receive the supply voltage, the first input voltage, and the bias voltage, and generate a drive voltage. The output voltage generator is configured to receive the supply voltage, a second input voltage, and the drive voltage, and generate an output voltage. The drive voltage controls a slew rate of the output voltage. The filter circuit is configured to receive the output voltage, and generates and provides the feedback voltage to the bias voltage generator.

20 Claims, 4 Drawing Sheets

(56) References Cited

U.S. PATENT DOCUMENTS

2012/0169381 A1     7/2012   Mei
2020/0252068 A1*   8/2020   Raychaudhuri .. H03K 3/356113

* cited by examiner

DRIVER CIRCUIT OF VOLTAGE TRANSLATOR

BACKGROUND

The present disclosure relates generally to electronic circuits, and, more particularly, to a driver circuit of a voltage translator.

Printed circuit boards (PCBs) include multiple components that operate within different voltage domains. A voltage translator is used as an interface between the components to convert input signals associated with one voltage domain to output signals associated with another voltage domain. The voltage translators are implemented for standard interfaces such as an inter-integrated circuit (I2C) interface, an improved inter-integrated circuit (I3C) interface, a serial peripheral interface (SPI), and system power management interface (SPMI).

A conventional voltage translator operates as desired when an output signal generated by the voltage translator propagates through smaller trace lengths on the PCB. However, when the output signal propagates through larger trace lengths, parasitic capacitances, resistances, and inductances associated with the voltage translator cause a degradation in performance of the voltage translator. As a result, undershoot and ringing effects are introduced in the output signal that may damage a component coupled with the voltage translator that receives the output signal. The conventional voltage translators utilize an external circuit to reduce the undershoot and ringing effects introduced in the output signal. However, utilization of the external circuit leads to an increase in a size and a manufacturing cost of a PCB that includes the voltage translator. Therefore, there exists a need for a voltage translator that solves the aforementioned problems of the conventional voltage translator.

SUMMARY

In one embodiment, a driver circuit of a voltage translator is disclosed. The driver circuit includes a bias voltage generator, a drive voltage generator, an output voltage generator, and a filter circuit. The bias voltage generator is configured to receive a supply voltage, a first input voltage, and a feedback voltage, and generate a bias voltage. The feedback voltage controls an amplitude of the bias voltage. The drive voltage generator is coupled with the bias voltage generator, and configured to receive the supply voltage, the first input voltage, and the bias voltage, and generate a drive voltage. The output voltage generator is coupled with the drive voltage generator, and configured to receive the supply voltage, a second input voltage, and the drive voltage, and generate an output voltage. The drive voltage controls a slew rate of the output voltage. The filter circuit is coupled with the output voltage generator and the bias voltage generator, and configured to receive the output voltage, and generate and provide the feedback voltage to the bias voltage generator.

In another embodiment, a voltage translator is disclosed. The voltage translator includes first and second one-shot circuits and first and second driver circuits. The first and second one-shot circuits are configured to receive first and second input voltages, respectively. Each of the first and second one-shot circuits is further configured to generate third and fourth input voltages when a corresponding input voltage of the first and second input voltages transitions between first and second states, respectively. The first and second driver circuits are coupled with the first and second one-shot circuits, respectively, and configured to receive first and second supply voltages, respectively. Each of the first and second driver circuits is further configured to receive the third and fourth input voltages, and generate an output voltage. Each of the first and second driver circuits includes a bias voltage generator, a drive voltage generator, an output voltage generator, and a filter circuit. The bias voltage generator is configured to receive a corresponding supply voltage of the first and second supply voltages, the third input voltage, and a feedback voltage, and generate a bias voltage. The feedback voltage controls an amplitude of the bias voltage. The drive voltage generator is coupled with the bias voltage generator, and configured to receive the corresponding supply voltage, the third input voltage, and the bias voltage, and generate a drive voltage. The output voltage generator is coupled with the drive voltage generator, and configured to receive the corresponding supply voltage, the fourth input voltage, and the drive voltage, and generate the output voltage. The drive voltage controls a slew rate of the output voltage. The filter circuit is coupled with the output voltage generator and the bias voltage generator, and configured to receive the output voltage, and generate and provide the feedback voltage to the bias voltage generator.

In yet another embodiment, a printed circuit board (PCB) is disclosed. The PCB includes a processor, a peripheral device, and a voltage translator. The processor is configured to operate at a first supply voltage and generate a first input voltage. The peripheral device is configured to operate at a second supply voltage and generate a second input voltage. The voltage translator is coupled between the processor and the peripheral device. The voltage translator includes first and second one-shot circuits and first and second driver circuits. The first and second one-shot circuits are configured to receive the second and first input voltages, respectively. Each of the first and second one-shot circuits is further configured to generate third and fourth input voltages when a corresponding input voltage of the first and second input voltages transitions between first and second states, respectively. The first and second driver circuits are coupled with the first and second one-shot circuits, respectively, and configured to receive the first and second supply voltages, respectively. Each of the first and second driver circuits is further configured to receive the third and fourth input voltages, and generate an output voltage. Each of the first and second driver circuits includes a bias voltage generator, a drive voltage generator, an output voltage generator, and a filter circuit. The bias voltage generator is configured to receive a corresponding supply voltage of the first and second supply voltages, the third input voltage, and a feedback voltage, and generate a bias voltage. The feedback voltage controls an amplitude of the bias voltage. The drive voltage generator is coupled with the bias voltage generator, and configured to receive the corresponding supply voltage, the third input voltage, and the bias voltage, and generate a drive voltage. The output voltage generator is coupled with the drive voltage generator, and configured to receive the corresponding supply voltage, the fourth input voltage, and the drive voltage, and generate the output voltage. The drive voltage controls a slew rate of the output voltage. The filter circuit is coupled with the output voltage generator and the bias voltage generator, and configured to receive the output voltage, and generate and provide the feedback voltage to the bias voltage generator.

In some embodiments, the bias voltage generator includes a first transistor, a first resistor, and a second transistor. The first transistor has a source terminal that is configured to receive the supply voltage, a gate terminal that is configured to receive the first input voltage, and a drain terminal that is configured to generate a first control voltage. The first resistor has a first terminal that is coupled with the drain terminal of the first transistor, and configured to receive the first control voltage. The second transistor has gate and drain terminals that are coupled with the filter circuit, and configured to receive the feedback voltage, and a source terminal that is coupled with a second terminal of the first resistor, and configured to receive an intermediate voltage, and generate and output the bias voltage. The intermediate voltage is generated based on the first control voltage and a voltage drop across the first resistor.

In some embodiments, the drive voltage generator includes third through sixth transistors. The third transistor has a source terminal that is configured to receive the supply voltage, a gate terminal that is configured to receive the first input voltage, and a drain terminal that is configured to generate a second control voltage. The fourth transistor has a source terminal that is coupled with a ground terminal, a gate terminal that is configured to receive the first input voltage, and a drain terminal that is configured to generate a third control voltage. The fifth transistor has a gate terminal that is coupled with the bias voltage generator, and configured to receive the bias voltage, a drain terminal that is coupled with the drain terminal of the third transistor, and configured to receive the second control voltage, and a source terminal that is coupled with the drain terminal of the fourth transistor, and configured to receive the third control voltage. The sixth transistor has a source terminal that is coupled with the drain terminal of the third transistor, and configured to receive the second control voltage, a gate terminal that is coupled with the bias voltage generator, and configured to receive the bias voltage, and a drain terminal that is coupled with the source terminal of the fourth transistor, and configured to receive the third control voltage, and generate and provide the drive voltage to the output voltage generator to control the slew rate of the output voltage.

In some embodiments, the output voltage generator includes seventh and eighth transistors and a resistive network. The seventh transistor has a source terminal that is configured to receive the supply voltage, a gate terminal that is configured to receive the second input voltage, and a drain terminal that is configured to generate a fourth control voltage. The eighth transistor has a source terminal that is coupled with a ground terminal, a gate terminal that is configured to receive the drive voltage, and a drain terminal that is configured to generate a fifth control voltage. The resistive network is coupled between the drain terminal of the seventh transistor and the drain terminal of the eighth transistor, and configured to receive the fourth and fifth control voltages, and generate the output voltage.

In some embodiments, the resistive network includes second and third resistors. The second resistor has a first terminal that is coupled with the drain terminal of the seventh transistor, and configured to receive the fourth control voltage. The third resistor has a first terminal that is coupled with the drain terminal of the eighth transistor, and configured to receive the fifth control voltage, and a second terminal that is coupled with a second terminal of the second resistor. The output voltage is generated based on a voltage drop across the second and third resistors and the fourth and fifth control voltages.

In some embodiments, the filter circuit includes a capacitor and a fourth resistor. The capacitor has a first terminal that is coupled with the output voltage generator, and configured to receive the output voltage, and a second terminal that is coupled with the bias voltage generator, and configured to output the feedback voltage. The capacitor is configured to charge based on the received output voltage to generate the feedback voltage. The fourth resistor has a first terminal that is coupled with the second terminal of the capacitor, and a second terminal that is coupled with a ground terminal. The feedback voltage is further generated based on resistance and capacitance values of the fourth resistor and the capacitor, respectively.

In some embodiments, the feedback voltage is generated based on the slew rate of the output voltage such that the slew rate of the output voltage is proportional to the feedback voltage, and the drive voltage is generated based on the bias voltage such that the drive voltage is proportional to the bias voltage.

In some embodiments, the first and second input voltages are first and second voltage pulses generated by a one-shot circuit that is coupled with the driver circuit.

Various embodiments of the present disclosure disclose a driver circuit of a voltage translator. The driver circuit includes a bias voltage generator, a drive voltage generator, an output voltage generator, and a filter circuit. The filter circuit generates a feedback voltage based on an output voltage. The bias voltage generator is configured to receive a supply voltage, a first input voltage, and the feedback voltage, and generate a bias voltage such that the feedback voltage controls an amplitude of the bias voltage. The drive voltage generator is configured to receive the supply voltage, the first input voltage, and the bias voltage, and generate a drive voltage. The output voltage generator is configured to receive the supply voltage, a second input voltage, and the drive voltage, and generate the output voltage such that the drive voltage controls a slew rate of the output voltage.

As the drive voltage controls the slew rate of the output voltage and the output voltage is utilized as a feedback to the bias generator, undershoot and ringing effects in the output voltage of the voltage translator are reduced when the output voltage propagates through greater trace lengths on a PCB that includes the voltage translator as compared to conventional voltage translators. Further, the requirement of an external circuit or an external component to reduce the undershoot and ringing effects introduced in the output voltage is eliminated. As a result, a size and a manufacturing cost of the PCB and reliability issues associated with the voltage translator are significantly reduced as compared to the conventional voltage translator that requires an external circuit for reducing the undershoot and ringing effects.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
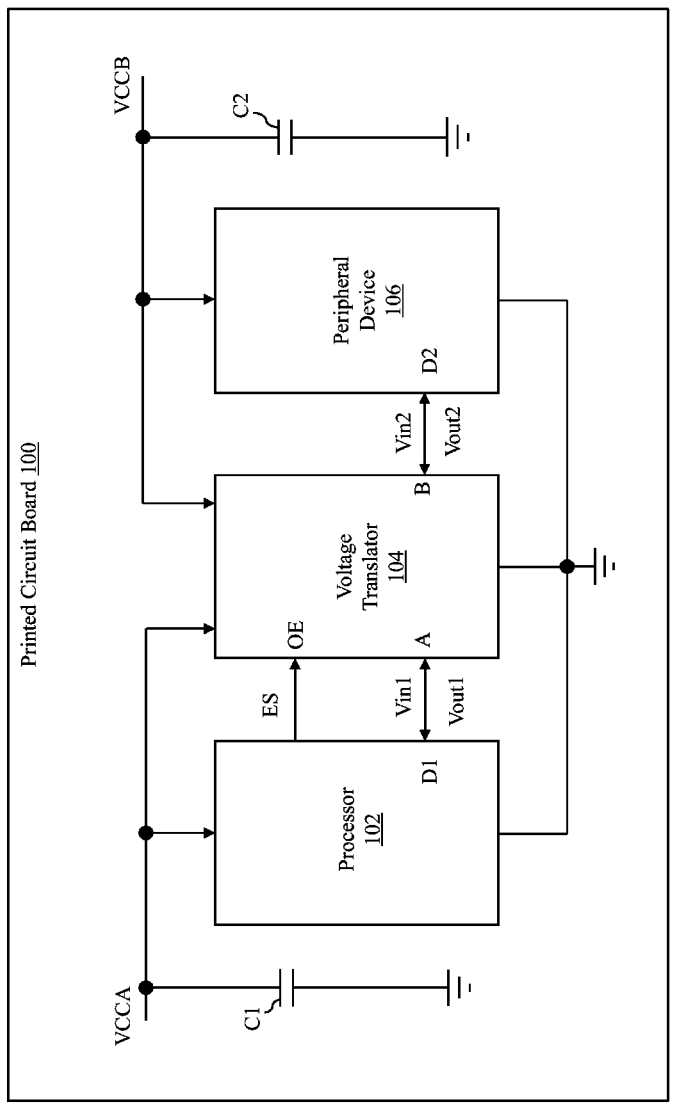
FIG. 1 is a schematic block diagram of a printed circuit board (PCB) in accordance with an embodiment of the present disclosure.

FIG. 1 is a schematic block diagram of a printed circuit board (PCB) 100 in accordance with an embodiment of the present disclosure. The PCB 100 includes a processor 102, a voltage translator 104, a peripheral device 106, and first and second capacitors C1 and C2.

The processor 102 is coupled between a first voltage source (not shown) and a ground terminal. The first voltage source generates a first supply voltage VCCA that is associated with a first voltage domain. The processor 102 is configured to operate at the first supply voltage VCCA. In one example, the first voltage domain corresponds to voltages in the range of '0-3.3' volts. The processor 102 is further configured to generate an enable signal ES. The enable signal ES indicates the voltage translator 104 to enable a voltage translation operation. The processor 102 is further configured to generate a first input voltage Vin1, output the first input voltage Vin1 at a first data terminal D1 of the processor 102, and receive a first output voltage Vout1 at the first data terminal D1. The first input voltage Vin1 and the first output voltage Vout1 are associated with the first voltage domain. Examples of the processor 102 include, but are not limited to, a microprocessor, a microcontroller, an application specific integrated circuit (ASIC), and a system-on-chip (SoC).

The voltage translator 104 is a bidirectional voltage translator, and is coupled between the processor 102 and the peripheral device 106. The voltage translator 104 is further coupled with the first voltage source, a second voltage source (not shown), and the ground terminal, and configured to receive the first supply voltage VCCA and a second supply voltage VCCB. The second voltage source is configured to generate the second supply voltage VCCB that is associated with a second voltage domain. In an embodiment, the second voltage domain is greater than the first voltage domain. In another embodiment, the first voltage domain is greater than the second voltage domain. For the sake of ongoing discussion, it is assumed that the second voltage domain is greater than the first voltage domain (i.e., VCCB>VCCA). In one example, the second voltage domain corresponds to voltages in the range of '0-5' volts.

The voltage translator 104 is configured to receive the enable signal ES at an output enable terminal OE of the voltage translator 104, the first input voltage Vin1 at a first input/output (I/O) terminal A of the voltage translator 104, and a second input voltage Vin2 at a second I/O terminal B of the voltage translator 104. Based on the enable signal ES, the voltage translator 104 is further configured to execute the voltage translation operation on the first input voltage Vin1 and the second input voltage Vin2 to generate a second output voltage Vout2 and the first output voltage Vout1, respectively. In one example, the voltage translator 104 executes the voltage translation operation when the enable signal ES is at a logic high state. The second input voltage Vin2 and the second output voltage Vout2 are associated with the second voltage domain. The voltage translator 104 is further configured to output the first output voltage Vout1 at the first I/O terminal A and the second output voltage Vout2 at the second I/O terminal B.

The peripheral device 106 is coupled between the second voltage source and the ground terminal. The peripheral device 106 is configured to operate at the second supply voltage VCCB. The peripheral device 106 is further coupled with the voltage translator 104, and configured to generate the second input voltage Vin2, output the second input voltage Vin2 at a second data terminal D2 of the peripheral device 106, and receive the second output voltage Vout2 at the second data terminal D2. Examples of the processor 102 include, but are not limited to, a subscriber identification module (SIM) card, a secure digital (SD) card, a multimedia card, and a memory.

The first capacitor C1 is coupled between the first voltage source and the ground terminal, and configured to filter voltage ripples in the first supply voltage VCCA. The second capacitor C2 is coupled between the second voltage source and the ground terminal, and configured to filter voltage ripples in the second supply voltage VCCB.

Figure 2:
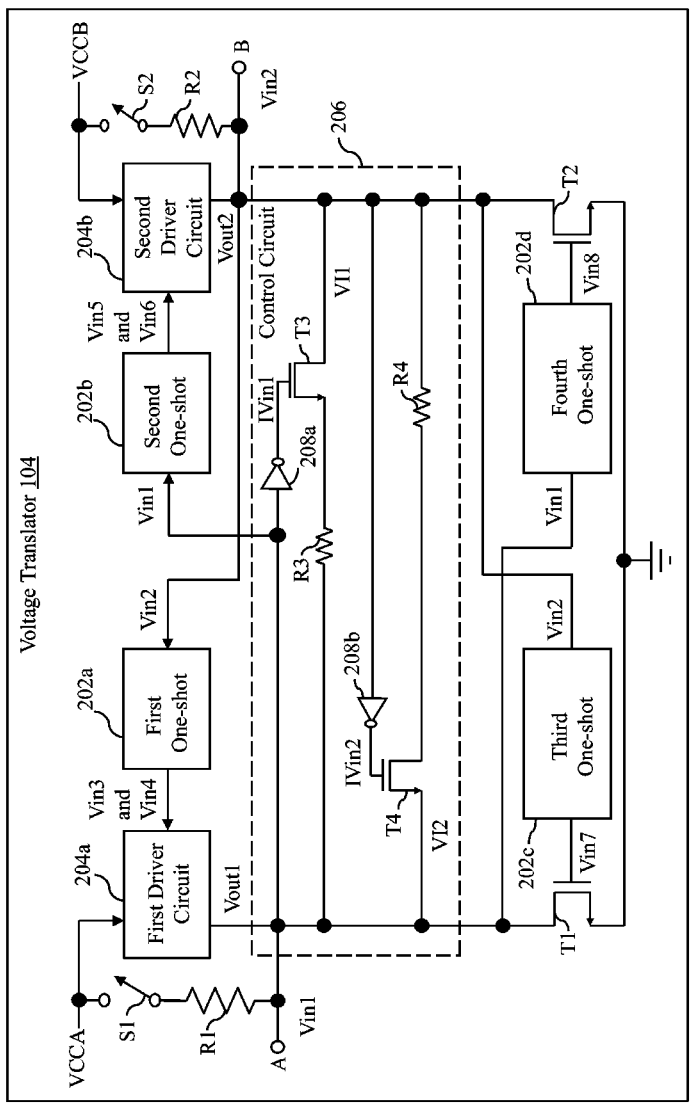
FIG. 2 is a schematic block diagram of a voltage translator of the PCB of FIG. 1 in accordance with an embodiment of the present disclosure.

FIG. 2 is a schematic block diagram of the voltage translator 104 in accordance with an embodiment of the present disclosure. The voltage translator 104 has first through fourth one-shot circuits 202a-202d, first and second driver circuits 204a and 204b, a control circuit 206, first and second resistors R1 and R2, first and second switches S1 and S2, and first and second transistors T1 and T2.

The first one-shot circuit 202a is coupled with the peripheral device 106 by way of the second I/O terminal B, and configured to receive the second input voltage Vin2. The first one-shot circuit 202a is further configured to generate third and fourth input voltages Vin3 and Vin4 based on the second input voltage Vin2. In one embodiment, the first one-shot circuit 202a generates the third and fourth input voltages Vin3 and Vin4 when the second input voltage Vin2 transitions between first and second states. The first state corresponds to a logic low state and the second state corresponds to a logic high state. In one example, the first one-shot circuit 202a generates the third and fourth input voltages Vin3 and Vin4 when the second input voltage Vin2 transitions from the logic high state to the logic low state. The third and fourth input voltages Vin3 and Vin4 are first and second voltage pulses generated by the first one-shot circuit 202a.

The first driver circuit 204a is coupled with the first voltage source and the first one-shot circuit 202a, and configured to receive the first supply voltage VCCA and the third and fourth input voltages Vin3 and Vin4. The first driver circuit 204a is further coupled with the processor 102 by way of the first I/O terminal A, and further configured to generate and provide the first output voltage Vout1 at the first I/O terminal A.

The first switch S1 and the first resistor R1 are coupled in parallel with the first driver circuit 204a. The first switch S1 has a first terminal that is coupled with the first voltage source, and configured to receive the first supply voltage VCCA. Further, the first switch S1 has a second terminal that is coupled with the first I/O terminal A, by way of the first resistor R1. The first switch S1 is configured to be ON during a rise time of the first input voltage Vin1 (i.e., when the first input voltage Vin1 is transitioning from a logic low state to a logic high state), and OFF during the remaining time. Thus, the first switch S1 is configured to reduce a leakage current at the first I/O terminal A.

The second one-shot circuit 202b is coupled with the processor 102 by way of the first I/O terminal A, and configured to receive the first input voltage Vin1. The second one-shot circuit 202b is further configured to generate fifth and sixth input voltages Vin5 and Vin6 based on the first input voltage Vin1. In one embodiment, the second one-shot circuit 202b generates the fifth and sixth input voltages Vin5 and Vin6 when the first input voltage Vin1 transitions between the first and second states. In one example, the second one-shot circuit 202b generates the fifth and sixth input voltages Vin5 and Vin6 when the first input voltage Vin1 transitions from the logic high state to the logic low state. The fifth and sixth input voltages Vin5 and Vin6 are third and fourth voltage pulses generated by the second one-shot circuit 202b, respectively.

The second driver circuit 204b is coupled with the second voltage source and the second one-shot circuit 202b, and configured to receive the second supply voltage VCCB and the fifth and sixth input voltages Vin5 and Vin6. The second driver circuit 204b is further coupled with the peripheral device 106 by way of the second I/O terminal B, and further configured to generate and provide the second output voltage Vout2 at the second I/O terminal B.

The second switch S2 and the second resistor R2 are coupled in parallel with the second driver circuit 204b. The second switch S2 has a first terminal that is coupled with the second voltage source, and configured to receive the second supply voltage VCCB. Further, the second switch S2 has a second terminal that is coupled with the second I/O terminal B, by way of the second resistor R2. The second switch S2 is configured to be ON during a rise time of the second input voltage Vin2 (i.e., when the second input voltage Vin2 is transitioning from the logic low state to the logic high state), and OFF during the remaining time. Thus, the second switch S2 is configured to reduce a leakage current at the second I/O terminal B.

The third one-shot circuit 202c is coupled with the peripheral device 106 by way of the second I/O terminal B, and configured to receive the second input voltage Vin2. The third one-shot circuit 202c is further configured to generate a seventh input voltage Vin7 based on the second input voltage Vin2. In one embodiment, the third one-shot circuit 202c generates the seventh input voltage Vin7 when the second input voltage Vin2 transitions between the first and second states. In one example, the third one-shot circuit 202c generates the seventh input voltage Vin7 when the second input voltage Vin2 transitions from the logic high state to the logic low state. The seventh input voltage Vin7 is a fifth voltage pulse generated by the third one-shot circuit 202c.

The first transistor T1 has a source terminal that is coupled with the ground terminal. The first transistor T1 further has gate and drain terminals that are coupled with the third one-shot circuit 202c and the first I/O terminal A, respectively, and configured to receive the seventh input voltage Vin7 and control the generation of the first output voltage Vout1, respectively.

The fourth one-shot circuit 202d is coupled with the processor 102 by way of the first I/O terminal A, and configured to receive the first input voltage Vin1. The fourth one-shot circuit 202d is further configured to generate an eighth input voltage Vin8 based on the first input voltage Vin1. In one embodiment, the fourth one-shot circuit 202d generates the eighth input voltage Vin8 when the first input voltage Vin1 transitions between the first and second states. In one example, the fourth one-shot circuit 202d generates the eighth input voltage Vin8 when the first input voltage Vin1 transitions from the logic high state to the logic low state. The eighth input voltage Vin8 is a sixth voltage pulse generated by the fourth one-shot circuit 202d.

The second transistor T2 has a source terminal that is coupled with the ground terminal. The second transistor T2 further has gate and drain terminals that are coupled with the fourth one-shot circuit 202d and the second I/O terminal B, respectively, and configured to receive the eighth input voltage Vin8 and control the generation of the second output voltage Vout2, respectively.

The control circuit 206 is coupled between the first and fourth one-shot circuits 202a and 202d, and the second and third one-shot circuits 202b and 202c, and configured to generate first and second intermediate voltages VI1 and VI2 to control the generation of the second and first output voltages Vout2 and Vout1, respectively. The control circuit 206 generates the first and second intermediate voltages VI1 and VI2 during a fall time of the first input voltage Vin1 (i.e., when the first input voltage Vin1 is transitioning from the logic high state to the logic low state) or the second input voltage Vin2 (i.e., when the second input voltage Vin2 is transitioning from the logic high state to the logic low state). The control circuit 206 includes third and fourth transistors T3 and T4, third and fourth resistors R3 and R4, and first and second inverters 208a and 208b.

The first inverter 208a is coupled with the first I/O terminal A, and configured to receive the first input voltage Vin1 and generate an inverted first input voltage IVin1. The third transistor T3 has a gate terminal that is coupled with the first inverter 208a, and configured to receive the inverted first input voltage IVin1. The third transistor T3 further has a source terminal that is coupled with the third resistor R3, and a drain terminal that is coupled with the second I/O terminal B, and configured to generate the first intermediate voltage VI1. The third resistor R3 is coupled between the source terminal of the third transistor T3 and the first I/O terminal A, and configured to receive the first input voltage Vin1.

The second inverter 208b is coupled with the second I/O terminal B, and configured to receive the second input voltage Vin2 and generate an inverted second input voltage IVin2. The fourth transistor T4 has a gate terminal that is coupled with the second inverter 208b, and configured to receive the inverted second input voltage IVin2. The fourth transistor T4 further has a source terminal that is coupled with the fourth resistor R4, and a drain terminal that is coupled with the first I/O terminal A, and configured to generate the second intermediate voltage VI2. The fourth resistor R4 is coupled between the source terminal of the fourth transistor T4 and the second I/O terminal B, and configured to receive the second input voltage Vin2. In one example, the first through fourth transistors T1-T4 are n-channel metal oxide semiconductor (NMOS) transistors.

When the first input voltage Vin1 transitions from the logic low state to the logic high state, the second output voltage Vout2 is pulled to a logic high state by the second driver circuit 204b, and when the first input voltage Vin1 is at the logic high state, the second output voltage Vout2 remains at the logic high state. Further, when the first input voltage Vin1 transitions from the logic high state to the logic low state, the second output voltage Vout2 is pulled to a logic low state by the second transistor T2, and when the first input voltage Vin1 is at the logic low state, the second output voltage Vout2 remains at the logic low state. Similarly, when the second input voltage Vin2 transitions from the logic low state to the logic high state, the first output voltage Vout1 is pulled to the logic high state by the first driver circuit 204a, and when the second input voltage Vin2 is at the logic high state, the first output voltage Vout1 remains at the logic high state. Further, when the second input voltage Vin2 transitions from the logic high state to the logic low state, the first output voltage Vout1 is pulled to the logic low state by the first transistor T1, and when the second input voltage Vin2 is at the logic low state, the first output voltage Vout1 remains at the logic low state.

Figure 3:
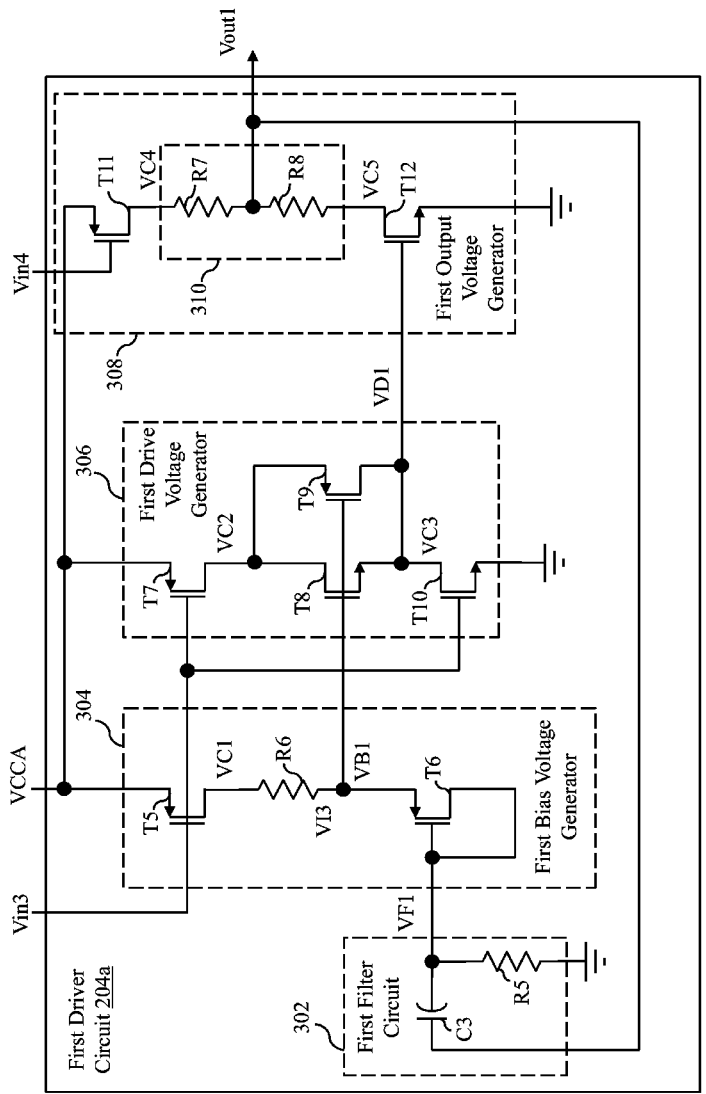
FIG. 3 is a schematic circuit diagram of a first driver circuit of the voltage translator of FIG. 2 in accordance with an embodiment of the present disclosure.

FIG. 3 is a schematic circuit diagram of the first driver circuit 204a in accordance with an embodiment of the present disclosure. The first driver circuit 204a includes a first filter circuit 302, a first bias voltage generator 304, a first drive voltage generator 306, and a first output voltage generator 308.

The first filter circuit 302 is coupled with the first output voltage generator 308 and the first bias voltage generator 304, and configured to receive the first output voltage Vout1, and generate and provide a first feedback voltage VF1 to the first bias voltage generator 304. In one embodiment, the first filter circuit 302 is a high pass filter. Thus, the first filter circuit 302 is further configured to filter the first output voltage Vout1 to generate the first feedback voltage VF1. The first filter circuit 302 includes a third capacitor C3 and a fifth resistor R5.

The third capacitor C3 has a first terminal that is coupled with the first output voltage generator 308, and configured to receive the first output voltage Vout1. The third capacitor C3 further has a second terminal that is coupled with the first bias voltage generator 304, and configured to output the first feedback voltage VF1. The third capacitor C3 is configured to charge based on the received first output voltage Vout1 to generate the first feedback voltage VF1. The fifth resistor R5 has a first terminal that is coupled with the second terminal of the third capacitor C3, and a second terminal that is coupled with the ground terminal. The first feedback voltage VF1 is further generated based on the first output voltage Vout1 and resistance and capacitance values of the fifth resistor R5 and the third capacitor C3. A cutoff frequency associated with the first filter circuit 302 is determined based on the resistance and capacitance values of the fifth resistor R5 and the third capacitor C3. In one embodiment, when a frequency of the first output voltage Vout1 is greater than the cutoff frequency, the first feedback voltage VF1 is generated at a logic high state, and when the frequency of the first output voltage Vout1 is less than the cutoff frequency, the first feedback voltage VF1 is generated at a logic low state. The generation of the first feedback voltage VF1 is further based on a slew rate of the first output voltage Vout1. When the slew rate of the first output voltage Vout1 is high, the first feedback voltage VF1 is generated at the logic high state, and when the slew rate of the first output voltage Vout1 is low, the first feedback voltage VF1 is generated at the logic low state The first bias voltage generator 304 is coupled with the first filter circuit 302 and the first voltage source, and configured to receive the first supply voltage VCCA and the first feedback voltage VF1. The first bias voltage generator 304 is further coupled with the first one-shot circuit 202a, and configured to receive the third input voltage Vin3. Further, the first bias voltage generator 304 is configured to generate a first bias voltage VB1 such that an amplitude of the first bias voltage VB1 is controlled by the first feedback voltage VF1. In one embodiment, the first bias voltage VB1 is inversely proportional to the first feedback voltage VF1. The first bias voltage generator 304 is activated (i.e., operational) on receiving the third input voltage Vin3 at a logic low state. The first bias voltage generator 304 includes fifth and sixth transistors T5 and T6 and a sixth resistor R6.

The fifth transistor T5 has a source terminal and a gate terminal that are coupled with the first voltage source and the first one-shot circuit 202a, respectively, and configured to receive the first supply voltage VCCA and the third input voltage Vin3, respectively. The fifth transistor T5 further has a drain terminal that is coupled with the sixth resistor R6, and configured to generate a first control voltage VC1. The sixth resistor R6 has a first terminal that is coupled with the drain terminal of the fifth transistor T5, and configured to receive the first control voltage VC1. The sixth resistor R6 further has a second terminal that is coupled with the sixth transistor T6.

The sixth transistor T6 has gate and drain terminals that are coupled with the first filter circuit 302, and configured to receive the first feedback voltage VF1. The sixth transistor T6 further has a source terminal that is coupled with the second terminal of the sixth resistor R6, and configured to receive a third intermediate voltage VI3 and control the generation of the first bias voltage VB1 based on the first feedback voltage VF1 and the third intermediate voltage VI3. The third intermediate voltage VI3 is generated based on the first control voltage VC1 and a voltage drop across the sixth resistor R6. In one example, the fifth and sixth transistors T5 and T6 are p-channel metal oxide semiconductor (PMOS) transistors. Thus, the fifth transistor T5 is activated (i.e., operational) when the third input voltage Vin3 is at the logic low state, thus the first bias voltage generator 304 is operational. When the sixth transistor T6 is configured to receive the first feedback voltage VF1 at a logic high state, the sixth transistor T6 pulls a low current and the first bias voltage VB1 is generated at a logic low state.

The first drive voltage generator 306 is coupled with the first bias voltage generator 304 and the first voltage source, and configured to receive the first supply voltage VCCA and the first bias voltage VB1. The first drive voltage generator 306 is further coupled with the first one-shot circuit 202a, and further configured to receive the third input voltage Vin3 and generate a first drive voltage VD1 such that the first drive voltage VD1 is directly proportional to the first bias voltage VB1. The first drive voltage generator 306 is activated (i.e., operational) on receiving the third input voltage Vin3 at the logic low state. The first drive voltage VD1 controls the slew rate of the first output voltage Vout1. The first drive voltage generator 306 includes seventh through tenth transistors T7-T10.

The seventh transistor T7 has a source terminal that is coupled with the first voltage source, and configured to receive the first supply voltage VCCA. The seventh transistor T7 further has a gate terminal that is coupled with the first one-shot circuit 202a, and configured to receive the third input voltage Vin3. Further, the seventh transistor T7 further has a drain terminal that is configured to generate a second control voltage VC2.

The eighth transistor T8 has gate and drain terminals that are coupled with the first bias voltage generator 304 and the drain terminal of the seventh transistor T7, respectively, and configured to receive the first bias voltage VB1, and the second control voltage VC2, respectively. The eighth transistor T8 further has a source terminal that is coupled with the tenth transistor T10, and configured to receive a third control voltage VC3.

The ninth transistor T9 has source and gate terminals that are coupled with the drain terminal of the seventh transistor T7 and the first bias voltage generator 304, respectively, and configured to receive the second control voltage VC2, and the first bias voltage VB1, respectively. The ninth transistor T9 further has a drain terminal that is coupled with the source terminal of the eighth transistor T8, and configured to receive the third control voltage VC3, and generate and provide the first drive voltage VD1 to the first output voltage generator 308 to control the slew rate of the first output voltage Vout1.

The tenth transistor T10 has a source terminal that is coupled with the ground terminal, and a gate terminal that is coupled with the first one-shot circuit 202a, and configured to receive the third input voltage Vin3. The tenth transistor T10 further has a drain terminal that is configured to generate the third control voltage VC3. In one example, the seventh and ninth transistors T7 and T9 are PMOS transistors and the eighth and tenth transistors T8 and T10 are NMOS transistors.

The first output voltage generator 308 is coupled with the first drive voltage generator 306 and the first voltage source, and configured to receive the first supply voltage VCCA and the first drive voltage VD1. The first output voltage generator 308 is further coupled with the first one-shot circuit 202a, and configured to receive the fourth input voltage Vin4. Further, the first output voltage generator 308 is coupled with the first filter circuit 302, and configured to generate and provide the first output voltage Vout1 to the first filter circuit 302. The first output voltage generator 308 includes eleventh and twelfth transistors T11 and T12, and a first resistive network 310.

The eleventh transistor T11 has a source terminal that is coupled with the first voltage source, and configured to receive the first supply voltage VCCA, and a gate terminal that is coupled with the first one-shot circuit 202a, and configured to receive the fourth input voltage Vin4. The eleventh transistor T11 further has a drain terminal that is configured to generate a fourth control voltage VC4.

The twelfth transistor T12 has a source terminal coupled with the ground terminal, and a gate terminal that is coupled with the first drive voltage generator 306, and configured to receive the first drive voltage VD1. The twelfth transistor T12 further has a drain terminal that is configured to generate a fifth control voltage VC5.

The first resistive network 310 is coupled between the drain terminal of the eleventh transistor T11 and the drain terminal of the twelfth transistor T12, and configured to receive the fourth and fifth control voltages VC4 and VC5, and generate the first output voltage Vout1. The first resistive network 310 includes seventh and eighth resistors R7 and R8.

The seventh resistor R7 has a first terminal that is coupled with the drain terminal of the eleventh transistor T11, and configured to receive the fourth control voltage VC4, and a second terminal that is coupled with the eighth resistor R8. The eighth resistor R8 has a first terminal that is coupled with the second terminal of the seventh resistor R7. The eighth resistor R8 further has a second terminal that is coupled with the drain terminal of the twelfth transistor T12, and configured to receive the fifth control voltage VC5. The first output voltage Vout1 is generated based on the fourth and fifth control voltages VC4 and VC5 and a voltage drop across the seventh and eighth resistors R7 and R8.

When the slew rate of the first output voltage Vout1 increases, an amplitude of the first feedback voltage VF1 increases and an amplitude of the first drive voltage VD1 decreases. The slew rate of the first output voltage Vout1 is controlled by the first drive voltage VD1 such that the slew rate of the first output voltage Vout1 is directly proportional to the first drive voltage VD1. Thus, when the amplitude of the first drive voltage VD1 decreases, the slew rate of the first output voltage Vout1 decreases, thereby reducing the undershoot and ringing effects in the first output voltage Vout1.

Figure 4:
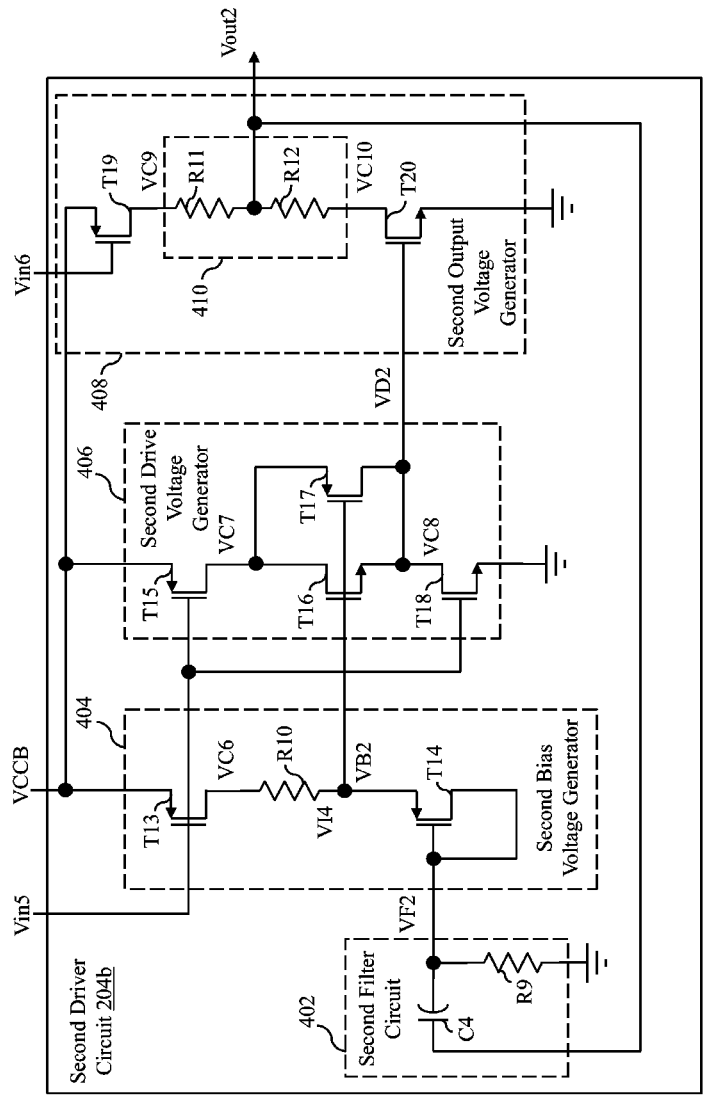
FIG. 4 is a schematic circuit diagram of a second driver circuit of the voltage translator of FIG. 2 in accordance with an embodiment of the present disclosure.

FIG. 4 is a schematic circuit diagram of the second driver circuit 204b in accordance with an embodiment of the present disclosure. The second driver circuit 204b includes a second filter circuit 402, a second bias voltage generator 404, a second drive voltage generator 406, and a second output voltage generator 408.

The second filter circuit 402 is coupled with the second output voltage generator 408 and the second bias voltage generator 404, and configured to receive the second output voltage Vout2, and generate and provide a second feedback voltage VF2 to the second bias voltage generator 404. In one embodiment, the second filter circuit 402 is a high pass filter. Thus, the second filter circuit 402 is further configured to filter the second output voltage Vout2 to generate the second feedback voltage VF2. The second filter circuit 402 includes a fourth capacitor C4 and a ninth resistor R9. The fourth capacitor C4 and the ninth resistor R9 operate in a manner similar to the operation of the third capacitor C3 and the fifth resistor R5 as described in FIG. 3 to generate the second feedback voltage VF2.

The second bias voltage generator 404 is coupled with the second filter circuit 402 and the second voltage source, and configured to receive the second supply voltage VCCB and the second feedback voltage VF2. The second bias voltage generator 404 is further coupled with the second one-shot circuit 202b, and configured to receive the fifth input voltage Vin5. Further, the second bias voltage generator 404 is configured to generate a second bias voltage VB2 such that an amplitude of the second bias voltage VB2 is controlled by the second feedback voltage VF2. In one embodiment, the second bias voltage VB2 is inversely proportional to the second feedback voltage VF2. The second bias voltage generator 404 is activated (i.e., operational) on receiving the fifth input voltage Vin5 at a logic low state. The second bias voltage generator 404 includes thirteenth and fourteenth transistors T13 and T14 and a tenth resistor R10.

The thirteenth transistor T13 has source and gate terminals that are coupled with the second voltage source and the second one-shot circuit 202b, respectively, and configured to receive the second supply voltage VCCB and the fifth input voltage Vin5, respectively. The thirteenth transistor T13 further has a drain terminal that is coupled with the tenth resistor R10, and configured to generate the sixth control voltage VC6. The tenth resistor R10 has a first terminal that is coupled with the drain terminal of the thirteenth transistor T13, and configured to receive the sixth control voltage VC6. The tenth resistor R10 further has a second terminal that is coupled with the fourteenth transistor T14.

The fourteenth transistor T14 has gate and drain terminals that are coupled with the second filter circuit 402, and configured to receive the second feedback voltage VF2. The fourteenth transistor T14 further has a source terminal that is coupled with the second terminal of the tenth resistor R10, and configured to receive a fourth intermediate voltage VI4, and control the generation of the second bias voltage VB2 based on the second feedback voltage VF2 and the fourth intermediate voltage VI4. The fourth intermediate voltage VI4 is generated based on the sixth control voltage VC6 and a voltage drop across the tenth resistor R10. In one example, the thirteenth and fourteenth transistors T13 and T14 are PMOS transistors.

The second drive voltage generator 406 is coupled with the second bias voltage generator 404 and the second voltage source, and configured to receive the second supply voltage VCCB and the second bias voltage VB2. The second drive voltage generator 406 is further coupled with the second one-shot circuit 202b, and further configured to receive the fifth input voltage Vin5 and generate a second drive voltage VD2 such that the second drive voltage VD2 is directly proportional to the second bias voltage VB2. The second drive voltage generator 406 is activated (i.e., operational) on receiving the fifth input voltage Vin5 at the logic low state. The second drive voltage VD2 controls the slew rate of the second output voltage Vout2. The second drive voltage generator 406 includes fifteenth through eighteenth transistors T15-T18.

The fifteenth and eighteenth transistors T15 and T18 operate in a manner similar to the operation of the seventh and tenth transistors T7 and T10 as described in FIG. 3 to generate seventh and eighth control voltages VC7 and VC8, respectively. The sixteenth and seventeenth transistors T16 and T17 operate in a manner similar to the operation of the eighth and ninth transistors T8 and T9 as described in FIG. 3 to generate the second drive voltage VD2. In one example, the fifteenth and seventeenth transistors T15 and T17 are PMOS transistors and the sixteenth and eighteenth transistors T16 and T18 are NMOS transistors.

The second output voltage generator 408 is coupled with the second drive voltage generator 406 and the second voltage source, and configured to receive the second supply voltage VCCB and the second drive voltage VD2. The second output voltage generator 408 is further coupled with the second one-shot circuit 202b, and configured to receive the sixth input voltage Vin6. Further, the second output voltage generator 408 is coupled with the second filter circuit 402, and configured to generate and provide the second output voltage Vout2 to the second filter circuit 402. The second output voltage generator 408 includes nineteenth and twentieth transistors T19 and T20, and a second resistive network 410.

The nineteenth and twentieth transistors T19 and T20 operate in a manner similar to the operation of the eleventh and twelfth transistors T11 and T12 as described in FIG. 3 to generate ninth and tenth control voltages VC9 and VC10, respectively. The second resistive network 410 includes eleventh and twelfth resistors R11 and R12. The eleventh and twelfth resistors R11 and R12 operate in a manner similar to the operation of the seventh and eighth transistors T7 and T8 as described in FIG. 3 to generate the second output voltage Vout2.

When the slew rate of the second output voltage Vout2 increases, an amplitude of the second feedback voltage VF2 increases and an amplitude of the second drive voltage VD2 decreases. The slew rate of the second output voltage Vout2 is controlled by the second drive voltage VD2 such that the slew rate of the second output voltage Vout2 is directly proportional to the second drive voltage VD2. Thus, when the amplitude of the second drive voltage VD2 decreases, the slew rate of the second output voltage Vout2 decreases, thereby reducing the undershoot and ringing effects in the second output voltage Vout2.

The first and second drive voltages VD1 and VD2 control the slew rates of the first and second output voltages Vout1 and Vout2 and the first and second output voltages Vout1 and Vout2 are utilized as a feedback to the first and second bias voltage generators 304 and 404, respectively. Thus, the undershoot and ringing effects in the first and second output voltages Vout1 and Vout2 of the voltage translator 104 are reduced when the first and second output voltages Vout1 and Vout2 propagate through greater trace lengths on the PCB 100 as compared to conventional voltage translators. Further, the requirement of an external circuit or an external component to reduce the undershoot and ringing effects introduced in the first and second output voltages Vout1 and Vout2 is eliminated. As a result, a size and a manufacturing cost, i.e., a bill of material (BOM), of the PCB 100 and reliability issues associated with the voltage translator 104 are significantly reduced as compared to the conventional voltage translator that requires an external circuit for reducing the undershoot and ringing effects.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A driver circuit of a voltage translator, the driver circuit comprising:
   a bias voltage generator that is configured to receive a supply voltage, a first input voltage, and a feedback voltage, and generate a bias voltage, wherein the feedback voltage controls an amplitude of the bias voltage;
   a drive voltage generator that is coupled with the bias voltage generator, and configured to receive the supply voltage, the first input voltage, and the bias voltage, and generate a drive voltage;
   an output voltage generator that is coupled with the drive voltage generator, and configured to receive the supply voltage, a second input voltage, and the drive voltage, and generate an output voltage, wherein the drive voltage controls a slew rate of the output voltage; and
   a filter circuit that is coupled with the output voltage generator and the bias voltage generator, and configured to receive the output voltage, and generate and provide the feedback voltage to the bias voltage generator.

2. The driver circuit of claim 1, wherein the bias voltage generator comprises:
   a first transistor, wherein the first transistor has (i) a source terminal that is configured to receive the supply voltage, (ii) a gate terminal that is configured to receive the first input voltage, and (iii) a drain terminal that is configured to generate a first control voltage;
   a first resistor, wherein the first resistor has a first terminal that is coupled with the drain terminal of the first transistor, and configured to receive the first control voltage; and
   a second transistor, wherein the second transistor has (i) gate and drain terminals that are coupled with the filter circuit, and configured to receive the feedback voltage, and (ii) a source terminal that is coupled with a second terminal of the first resistor, and configured to receive an intermediate voltage, and generate and output the bias voltage, and wherein the intermediate voltage is generated based on the first control voltage and a voltage drop across the first resistor.

3. The driver circuit of claim 1, wherein the drive voltage generator comprises:

a third transistor, wherein the third transistor has (i) a source terminal that is configured to receive the supply voltage, (ii) a gate terminal that is configured to receive the first input voltage, and (iii) a drain terminal that is configured to generate a second control voltage;
a fourth transistor, wherein the fourth transistor has (i) a source terminal that is coupled with a ground terminal, (ii) a gate terminal that is configured to receive the first input voltage, and (iii) a drain terminal that is configured to generate a third control voltage;
a fifth transistor, wherein the fifth transistor has (i) a gate terminal that is coupled with the bias voltage generator, and configured to receive the bias voltage, (ii) a drain terminal that is coupled with the drain terminal of the third transistor, and configured to receive the second control voltage, and (iii) a source terminal that is coupled with the drain terminal of the fourth transistor, and configured to receive the third control voltage; and
a sixth transistor, wherein the sixth transistor has (i) a source terminal that is coupled with the drain terminal of the third transistor, and configured to receive the second control voltage, (ii) a gate terminal that is coupled with the bias voltage generator, and configured to receive the bias voltage, and (iii) a drain terminal that is coupled with the source terminal of the fourth transistor, and configured to receive the third control voltage, and generate and provide the drive voltage to the output voltage generator to control the slew rate of the output voltage.

4. The driver circuit of claim 1, wherein the output voltage generator comprises:
a seventh transistor, wherein the seventh transistor has (i) a source terminal that is configured to receive the supply voltage, (ii) a gate terminal that is configured to receive the second input voltage, and (iii) a drain terminal that is configured to generate a fourth control voltage;
an eighth transistor, wherein the eighth transistor has (i) a source terminal that is coupled with a ground terminal, (ii) a gate terminal that is configured to receive the drive voltage, and (iii) a drain terminal that is configured to generate a fifth control voltage; and
a resistive network that is coupled between the drain terminal of the seventh transistor and the drain terminal of the eighth transistor, and configured to receive the fourth and fifth control voltages, and generate the output voltage.

5. The driver circuit of claim 4, wherein the resistive network comprises:
a second resistor, wherein the second resistor has a first terminal that is coupled with the drain terminal of the seventh transistor, and configured to receive the fourth control voltage; and
a third resistor, wherein the third resistor has (i) a first terminal that is coupled with the drain terminal of the eighth transistor, and configured to receive the fifth control voltage, and (ii) a second terminal that is coupled with a second terminal of the second resistor, and wherein the output voltage is generated based on a voltage drop across the second and third resistors and the fourth and fifth control voltages.

6. The driver circuit of claim 1, wherein the filter circuit includes:
a capacitor, wherein the capacitor has (i) a first terminal that is coupled with the output voltage generator, and configured to receive the output voltage, and (ii) a second terminal that is coupled with the bias voltage generator, and configured to output the feedback voltage, and wherein the capacitor is configured to charge based on the received output voltage to generate the feedback voltage; and
a fourth resistor, wherein the fourth resistor has (i) a first terminal that is coupled with the second terminal of the capacitor, and (ii) a second terminal that is coupled with a ground terminal, and wherein the feedback voltage is further generated based on resistance and capacitance values of the fourth resistor and the capacitor, respectively.

7. The driver circuit of claim 1, wherein (i) the feedback voltage is generated based on the slew rate of the output voltage such that the slew rate of the output voltage is proportional to the feedback voltage, and (ii) the drive voltage is generated based on the bias voltage such that the drive voltage is proportional to the bias voltage.

8. The driver circuit of claim 1, wherein the first and second input voltages are first and second voltage pulses generated by a one-shot circuit that is coupled with the driver circuit, respectively.

9. A voltage translator, comprising:
first and second one-shot circuits that are configured to receive first and second input voltages, respectively, wherein each of the first and second one-shot circuits is further configured to generate a respective third and fourth input voltages when a corresponding input voltage of the first and second input voltages transitions between first and second states, respectively; and
first and second driver circuits that are coupled with the first and second one-shot circuits, respectively, and configured to receive first and second supply voltages, respectively, wherein the first driver circuit is further configured to receive the third and fourth input voltages of the first one-shot circuit, the second driver circuit is further configured to receive the third and fourth input voltages of the second one-shot circuit, and wherein each of the first and second driver circuits comprises:
a bias voltage generator that is configured to receive a corresponding supply voltage of the first and second supply voltages, a bias input voltage, and a feedback voltage, and generate a bias output voltage, wherein the feedback voltage controls an amplitude of the bias output voltage, wherein the bias input voltage of the first driver circuit is the third input voltage of the first one-shot circuit; and wherein the bias input voltage of the second driver circuit is the third input voltage of the second-shot circuit;
a drive voltage generator that is coupled with the bias voltage generator, and configured to receive the corresponding supply voltage, the bias input voltage, and the bias output voltage, and generate a drive voltage;
an output voltage generator that is coupled with the drive voltage generator, and configured to receive the corresponding supply voltage, a generator input voltage, and the drive voltage, and generate a generator output voltage, wherein the drive voltage controls a slew rate of the generator output voltage, wherein the generator input voltage of the first driver circuit is the fourth input voltage of the first one-shot circuit; and wherein the generator input voltage of the second driver circuit is the fourth input voltage of the second one-shot circuit; and
a filter circuit that is coupled with the output voltage generator and the bias voltage generator, and configured to receive the generator output voltage, and generate and provide the feedback voltage to the bias voltage generator.

10. The voltage translator of claim 9, further comprising third and fourth one-shot circuits that are coupled with the second and first driver circuits and the second and first one-shot circuits, respectively, and configured to receive the second and first input voltages, respectively, wherein each of the third and fourth one-shot circuits is further configured to generate a respective fifth input voltage, wherein the fifth input voltage of the third one-shot circuit controls the generation of the generator output voltage for the first driver circuit and the fifth input voltage of the fourth one-shot circuit controls the generation of the generator output voltage for the second driver circuit.

11. The voltage translator of claim 10, further comprises a control circuit that is coupled between the first and fourth one-shot circuits and the second and third one-shot circuits, and configured to generate first and second intermediate voltages to control the generation of the generator output voltage of the first and second driver circuits.

12. The voltage translator of claim 9, wherein the bias voltage generator includes:
a first transistor, wherein the first transistor has (i) a source terminal that is configured to receive the corresponding supply voltage, (ii) a gate terminal that is configured to receive the bias input voltage, and (iii) a drain terminal that is configured to generate a first control voltage;
a first resistor, wherein the first resistor has a first terminal that is coupled with the drain terminal of the first transistor, and configured to receive the first control voltage; and
a second transistor, wherein the second transistor has (i) gate and drain terminals that are coupled with the filter circuit, and configured to receive the feedback voltage, and (ii) a source terminal that is coupled with a second terminal of the first resistor, and configured to receive a third intermediate voltage, and generate and output the bias output voltage, and wherein the third intermediate voltage is generated based on the first control voltage and a voltage drop across the first resistor.

13. The voltage translator of claim 9, wherein the drive voltage generator comprises:
a third transistor, wherein the third transistor has (i) a source terminal that is configured to receive the corresponding supply voltage, (ii) a gate terminal that is configured to receive the bias input voltage, and (iii) a drain terminal that is configured to generate a second control voltage;
a fourth transistor, wherein the fourth transistor has (i) a source terminal that is coupled with a ground terminal, (ii) a gate terminal that is configured to receive the bias input voltage, and (iii) a drain terminal that is configured to generate a third control voltage;
a fifth transistor, wherein the fifth transistor has (i) a gate terminal that is coupled with the bias voltage generator, and configured to receive the bias output voltage, (ii) a drain terminal that is coupled with the drain terminal of the third transistor, and configured to receive the second control voltage, and (iii) a source terminal that is coupled with the drain terminal of the fourth transistor, and configured to receive the third control voltage; and
a sixth transistor, wherein the sixth transistor has (i) a source terminal that is coupled with the drain terminal of the third transistor, and configured to receive the second control voltage, (ii) a gate terminal that is coupled with the bias voltage generator, and configured to receive the bias output voltage, and (iii) a drain terminal that is coupled with the source terminal of the fourth transistor, and configured to receive the third control voltage, and generate and provide the drive voltage to the output voltage generator to control the slew rate of the generator output voltage.

14. The voltage translator of claim 9, wherein the output voltage generator comprises: a seventh transistor, wherein the seventh transistor has (i) a source terminal that is configured to receive the corresponding supply voltage, (ii) a gate terminal that is configured to receive the generator input voltage, and (iii) a drain terminal that is configured to generate a fourth control voltage; an eighth transistor, wherein the eighth transistor has (i) a source terminal that is coupled with a ground terminal, (ii) a gate terminal that is configured to receive the drive voltage, and (iii) a drain terminal that is configured to generate a fifth control voltage; and a resistive network that is coupled between the drain terminal of the seventh transistor and the drain terminal of the eighth transistor, and configured to receive the fourth and fifth control voltages, and generate the generator output voltage.

15. The voltage translator of claim 14, wherein the resistive network comprises:
a second resistor, wherein the second resistor has a first terminal that is coupled with the drain terminal of the seventh transistor, and configured to receive the fourth control voltage; and
a third resistor, wherein the third resistor has (i) a first terminal that is coupled with the drain terminal of the eighth transistor, and configured to receive the fifth control voltage, and (ii) a second terminal that is coupled with a second terminal of the second resistor, and wherein the generator output voltage is generated based on a voltage drop across the second and third resistors and the fourth and fifth control voltages.

16. The voltage translator of claim 9, wherein the filter circuit includes:
a capacitor, wherein the capacitor has (i) a first terminal that is coupled with the output voltage generator, and configured to receive the generator output voltage, and (ii) a second terminal that is coupled with the bias voltage generator, and configured to output the feedback voltage, and wherein the capacitor is configured to charge based on the received generator output voltage to generate the feedback voltage; and
a fourth resistor, wherein the fourth resistor has (i) a first terminal that is coupled with the second terminal of the capacitor, and (ii) a second terminal that is coupled with a ground terminal, and wherein the feedback voltage is further generated based on resistance and capacitance values of the fourth resistor and the capacitor, respectively.

17. The voltage translator of claim 9, wherein (i) the feedback voltage is generated based on the slew rate of the generator output voltage such that the slew rate of the generator output voltage is proportional to the feedback voltage, and (ii) the drive voltage is generated based on the bias output voltage such that the drive voltage is proportional to the bias output voltage.

18. The voltage translator of claim 9, wherein the first and second input voltages are associated with first and second voltage domains, respectively, and wherein the first and second voltage domains are different.

19. The voltage translator of claim 9, wherein the first state corresponds to a logic low state and the second state corresponds to a logic high state.

20. A printed circuit board, comprising:
- a processor that is configured to operate at a first supply voltage and generate a first input voltage;
- a peripheral device that is configured to operate at a second supply voltage and generate a second input voltage; and
- a voltage translator that is coupled between the processor and the peripheral device, the voltage translator comprising:
  - first and second one-shot circuits that are configured to receive the second and first input voltages, respectively, wherein each of the first and second one-shot circuits is further configured to generate a respective third and fourth input voltages when a corresponding input voltage of the first and second input voltages transitions between first and second states, respectively; and
  - first and second driver circuits that are coupled with the first and second one-shot circuits, respectively, and configured to receive the first and second supply voltages, respectively, wherein the first driver circuit is further configured to receive the third and fourth input voltages of the first one-shot circuit, the second driver circuit is further configured to receive the third and fourth input voltages of the second one-shot circuit, and wherein each of the first and second driver circuits comprises:
    - a bias voltage generator that is configured to receive a corresponding supply voltage of the first and second supply voltages, a bias input voltage, and a feedback voltage, and generate a bias output voltage, wherein the feedback voltage controls an amplitude of the bias output voltage, wherein the bias input voltage of the first driver circuit is the third input voltage of the first one-shot circuit; and wherein the bias input voltage of the second driver circuit is the third input voltage of the second one-shot circuit;
    - a drive voltage generator that is coupled with the bias voltage generator, and configured to receive the corresponding supply voltage, the bias input voltage, and the bias output voltage, and generate a drive voltage;
    - an output voltage generator that is coupled with the drive voltage generator, and configured to receive the corresponding supply voltage, a generator input voltage, and the drive voltage, and generate the generator output voltage, wherein the drive voltage controls a slew rate of the generator output voltage, wherein the generator input voltage of the first driver circuit is the fourth input voltage of the first one-shot circuit; and wherein the generator input voltage of the second driver circuit is the fourth input voltage of the second one-shot circuit; and
    - a filter circuit that is coupled with the output voltage generator and the bias voltage generator, and configured to receive the generator output voltage, and generate and provide the feedback voltage to the bias voltage generator.

* * * * *